(12) United States Patent
Shirakawa et al.

(10) Patent No.: US 7,973,620 B2
(45) Date of Patent: Jul. 5, 2011

(54) POWER AMPLIFIER FILTER FOR RADIO-FREQUENCY SIGNALS

(75) Inventors: Alexandre Shirakawa, San Jose, CA (US); Jean-Baptiste David, Grenoble (FR); Patrick Wurm, Voreppe (FR); Claire Auer (Wurm), legal representative, Strasbourg (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 12/831,479

(22) Filed: Jul. 7, 2010

(65) Prior Publication Data

US 2010/0301968 A1    Dec. 2, 2010

Related U.S. Application Data

(63) Continuation of application No. PCT/EP2009/050350, filed on Jan. 14, 2009.

(60) Provisional application No. 61/036,150, filed on Mar. 13, 2008.

(30) Foreign Application Priority Data

Jan. 15, 2008  (FR) .................................. 08 50232

(51) Int. Cl.
*H03H 9/54* (2006.01)
*H03F 3/68* (2006.01)

(52) U.S. Cl. .................. 333/189; 375/297; 330/124 R; 330/295

(58) Field of Classification Search .......... 333/187–192; 330/295, 124 R, 302; 375/297
See application file for complete search history.

(56) References Cited

U.S. PATENT DOCUMENTS

| | | | |
|---|---|---|---|
| 6,552,634 B1 * | 4/2003 | Raab | 333/216 |
| 6,741,146 B2 * | 5/2004 | Ella | 333/133 |
| 2005/0012570 A1 | 1/2005 | Korden et al. | |
| 2005/0206476 A1 | 9/2005 | Ella et al. | |
| 2006/0078067 A1 | 4/2006 | Brobston | |
| 2007/0090892 A1 | 4/2007 | Larson, III | |
| 2008/0129411 A1 * | 6/2008 | Beaudin et al. | 333/133 |
| 2008/0297277 A1 | 12/2008 | Meister et al. | |
| 2009/0096550 A1 * | 4/2009 | Handtmann et al. | 333/189 |
| 2010/0272214 A1 * | 10/2010 | Wurm et al. | 375/297 |

FOREIGN PATENT DOCUMENTS

| | | |
|---|---|---|
| DE | 103 19 554 A1 | 11/2004 |
| DE | 10 2004 049 499 A1 | 4/2006 |

OTHER PUBLICATIONS

Vinay Kulkarni et al., "Bandwidth Improvement Methods in Acoustically-Coupled Thin Film BAW Devices," International Frequency Control Symposium and Exposition, 2006, IEEE, PI, Jun. 1, 2006, pp. 165-171.

* cited by examiner

*Primary Examiner* — Barbara Summons
(74) *Attorney, Agent, or Firm* — Burr & Brown

(57) ABSTRACT

A power amplifier filter for radio-frequency signals having an outphasing type architecture comprising a first stage (2) capable of generating, from an input signal s(t), two signals $s_1(t)$, $s_2(t)$ having an identical amplitude but phase shifted relative to each other, a second amplifier stage (3) for said signals $s_1(t)$, $s_2(t)$, and a third recombining stage (4) capable of summing the two signals $s'_1(t)$, $s'_2(t)$ obtained from second stage (3), characterized in that recombining stage (4) includes an assembly of acoustic wave resonators coupled to each other, some of these resonators referred to as "input resonators" being connected to the outputs of second stage (4) and others of these resonators referred to as "output resonators" being connected to the output terminals of the filter.

8 Claims, 4 Drawing Sheets

POWER AMPLIFIER FILTER FOR RADIO-FREQUENCY SIGNALS

FIELD OF THE INVENTION

The invention relates to the field of electronic amplifier modules used in signal processing and amplification chains, especially for mobile communication terminals. It relates more especially to an amplifier architecture which uses bulk-acoustic wave resonator type components which make it possible to optimize power consumption relative to performance and amplification quality.

DESCRIPTION OF THE PRIOR ART

Many mobile communication devices such as mobile phones and other computing terminals operate by sending and receiving waves in the radio-frequency band. These devices comprise a transmit module which feeds a signal to an antenna, the signal having been generated on the basis of data signals which are, generally speaking, digital.

In terms of performance, these transmit modules need to be analyzed in respect of various parameters. Thus, to the extent that the devices in which they are fitted are frequently portable, one important criterion is their power consumption because this has a direct influence on the device's battery life. Attempts are therefore generally made to achieve a low power consumption.

In addition, for spectral occupation reasons, signals undergo both phase and amplitude modulation operations before transmission. However, generally speaking, signals having a non-constant amplitude or a variable envelope impose constraints on the type of amplifier which can be used. In fact, it is preferable to use linear-response amplifiers to amplify signals having a non-constant amplitude in order to avoid distortion.

Unfortunately, linear amplifiers perform less well in terms of power consumption than non-linear amplifiers.

Moreover, bearing in mind the spectrum packing density of communication systems which share the same frequency band, it is essential to ensure that transmission systems generate extremely little interference in adjacent frequency bands by using highly selective output filtering.

Certain techniques have been developed in order to allow the use of non-linear amplifiers to amplify signals having a non-constant amplitude. A technique known as "outphasing" makes it possible to achieve satisfactory results. This technique involves using a variable-amplitude signal to generate two constant-amplitude signals having a phase difference which varies depending on the amplitude of the original signal.

These two intermediate signals which have a constant amplitude can thus be amplified by non-linear amplifiers without any risk of introducing signal distortion because the amplitude information is no longer the information carrier.

These two intermediate signals are added by a recombining stage. Thanks to the opposite phase difference of the two intermediate signals, this recombination makes it possible to obtain a variable-amplitude output signal having the same function as that of the original signal, but after amplification.

This "outphasing" technique, based on theoretical work described by CHIREIX in "High power outphasing modulation", in Proc IRE, Volume 23 November 1935, pages 1370 to 1392, has been the subject of various improvements, including that described in Document US 2006/0078067.

At present, amplifier modules which use the "outphasing" operating principle use signal recombining stages which employ passive components such as transformers, quarter wavelength transmission lines or magnetic couplers. Such components are inherently relatively bulky and perform poorly in the main and are therefore unsuitable for use in applications in mobile terminals.

One of the objects of the invention is therefore to provide a solution to produce a recombining stage which is acceptable in terms of its overall dimensions and efficiency.

SUMMARY OF THE INVENTION

The invention therefore relates to a power amplifier filter for radio-frequency signals which has an "outphasing" type architecture. Classically, this architecture comprises a first stage capable of generating, from one input signal, two signals having an identical amplitude but phase shifted relative to each other depending on the amplitude of the input signal. This filter also comprises a second amplifier stage for the two signals thus generated and a third recombining stage capable of adding the two signals obtained from the second stage, after amplification.

According to the invention, the filter is characterized in that the recombining stage includes an assembly of bulk-acoustic wave resonators coupled to each other, with some of these resonators, referred to as "input resonators", being connected to the outputs of the second stage and others of these resonators, referred to as "output resonators", being connected to the output terminals of the filter.

In other words, the invention involves ensuring recombination of two amplified signals by using a bulk-acoustic wave filter which is also referred to as a BAW-CRF or "bulk acoustic wave coupled-resonator filter".

This type of filter is especially suitable for the recombining stage of "outphasing" amplifiers because the input resonators of this stage are not electrically coupled to the output resonators. In addition, the performance of BAW-CRF filters, in terms of efficiency, combined with their very compact dimensions, makes them an acceptable solution for outphasing-type filtering in mobile equipment.

BAW-CRF filters consist of a stack of several bulk acoustic wave resonators which are coupled by an assembly of acoustically passive layers. Each resonator comprises a piezo-electric layer which is sandwiched between two electrodes.

In practice, various architectures can be used in order to produce a recombining stage depending on the number of resonators and the way the various resonators are arranged relative to each other.

In a first embodiment, it is possible for the input resonators to be acoustically coupled to the output resonators, the electrodes of which then form the output terminals of the filter.

In other words, the input resonators and the output resonator are produced in a stack configuration on the axis along which the acoustic energy propagates. The two acoustic signals output by each of the input resonators are recombined inside the output resonator by propagation through the various mechanical coupling layers between these resonators.

In a second embodiment, the output resonators can be electrically connected to each other so that the electrical signals generated by each of the output resonators are combined in order to output the recombined overall signal, for example, by voltage summing if the output resonators are electrically connected in series.

In practice, energy can be transmitted between the input resonators and the output resonators directly through the acoustic coupling layers or through one or more series of intermediate resonators.

In practice, it is possible to provide particular arrangements as far as the electrical connections between the input resonators and also between the output resonators are concerned in order to ensure impedance matching. Thus, the various input resonators which are connected to one of the outputs of the amplifier stage may be electrically connected in parallel whereas the corresponding output resonators may be all connected in series, this making it possible to obtain impedance conversion between the input of the recombining stage relative to its output.

The output impedance can thus be adapted relative to the impedance value at the antenna.

In one advantageous embodiment, the amplifier filter may include an intermediate filter stage fitted between the first and second stages, i.e. upstream from the power amplifier. In order to improve its compactness, this intermediate filter stage may advantageously include assemblies of acoustic wave-coupled resonators.

BRIEF DESCRIPTION OF THE DRAWINGS

In order that the way in which the invention is implemented and its resulting advantages may more readily be understood, the following description is given, reference being made to the accompanying drawings.

DESCRIPTION OF THE PREFERRED EMBODIMENTS

Figure 1:
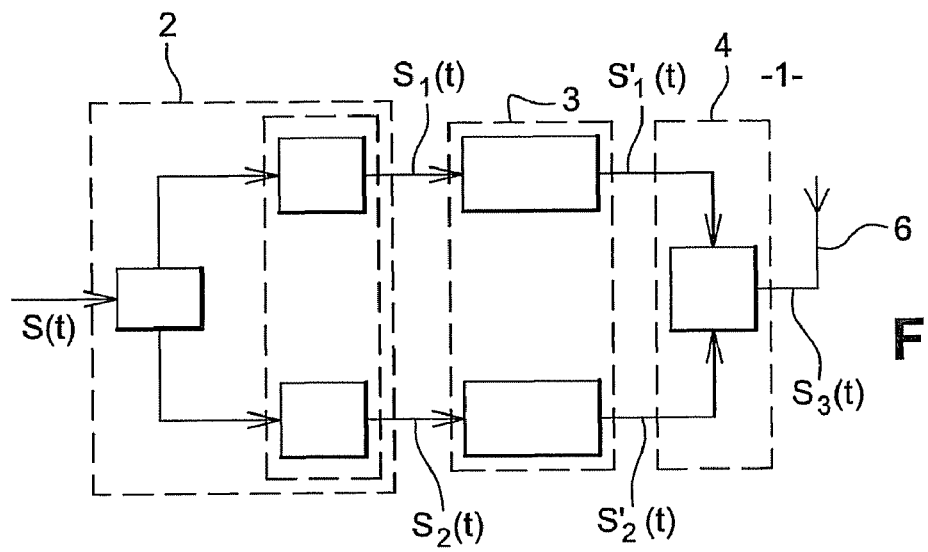
FIG. 1 is an overall schematic view of a filter system in accordance with the invention, operation of the system is shown in FIG. 2.

As already stated, the invention relates to a power amplifier filter for radio-frequency signals which has an overall architecture as shown in FIG. 1. Thus, filter (1) has a first stage (2) which receives, on its input, signal S(t) which is to be amplified. This first stage (2) outputs two signals $S_1(t)$ and $S_2(t)$. A second stage (3) provides power amplification. This amplifier stage (3) outputs two amplified signals $S'_1(t)$ and $S'_2(t)$. A third recombining stage (4) outputs amplified signal $S_3(t)$ to antenna (6).

Figure 2:
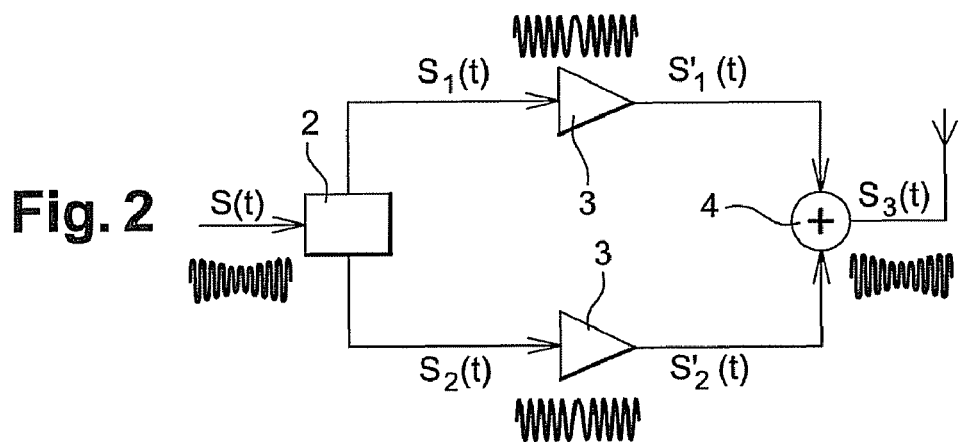

This filter (1) operates according to the so-called outphasing amplification principle which is illustrated in FIG. 2.

Input signal S(t) has a variable amplitude, $s(t)=A(t)\cdot\cos(\omega t)$. The function of first stage (2) is to generate, from input signal $S_2(t)$, two signals which have a constant amplitude $A_0$ but are out of phase relative to each other respectively by a leading or lagging phase difference $\phi$ in accordance with the following equations:

$$s_1(t)=A_0\cos(\omega t+\phi)$$

$$s_2(t)=A_0\cos(\omega t-\phi)$$

Phase difference $\phi$ is selected as a function of the amplitude A of the state of the input signal ($\phi=\cos^{-1}[A(t)]$). Second stage (3) amplifies the two signals thus generated using amplifier structures which can be advantageously chosen with a non-linear characteristic in order to optimize energy efficiency.

The two signals thus generated are amplified in accordance with the two equations below:

$$s'_1(t)=G_0\cdot s_1(t)=G_0\cdot A_0\cdot\cos(\omega t+\phi)$$

$$s'_2(t)=G_0\cdot s_2(t)=G_0\cdot A_0\cdot\cos(\omega t+\phi)$$

The third distinctive stage (4) recombines the two signals $s'_1(t)$, $s'_2(t)$, so as to sum them. This summing makes it possible to obtain signal $s_3$ which is defined as follows:

$$s_3(t)=G_0\cdot A_0\cdot\cos(\omega t+\phi)+G_0\cdot A_0\cdot\cos(\omega t+\phi)$$

Thanks to the opposite phase difference of the two intermediate signals $S'_1(t)$ and $S'_2(t)$, this summing makes it possible to obtain an output signal $s_3$ which corresponds to the amplified input signal S(t) in accordance with the following equations:

$$s_3(t)=G_0\cdot A_0\cdot[2\cdot\cos(\omega t)\cdot\cos(\phi)]=G_0\cdot A_0\cdot[2\cdot\cos(\omega t)\cdot\cos(\cos^{-1}(A(t)))]=2\cdot G_0\cdot A_0\cdot A(t)\cdot\cos(\omega t)=2\cdot G_0\cdot A_0\cdot s(t)$$

Thus, using a non-linear amplifier stage, overall amplification with very low distortion is achieved for signals having a variable amplitude or a variable envelope.

According to the invention, third recombining stage (4) is based on filters which include bulk acoustic wave resonators which are coupled to each other.

Figure 3:
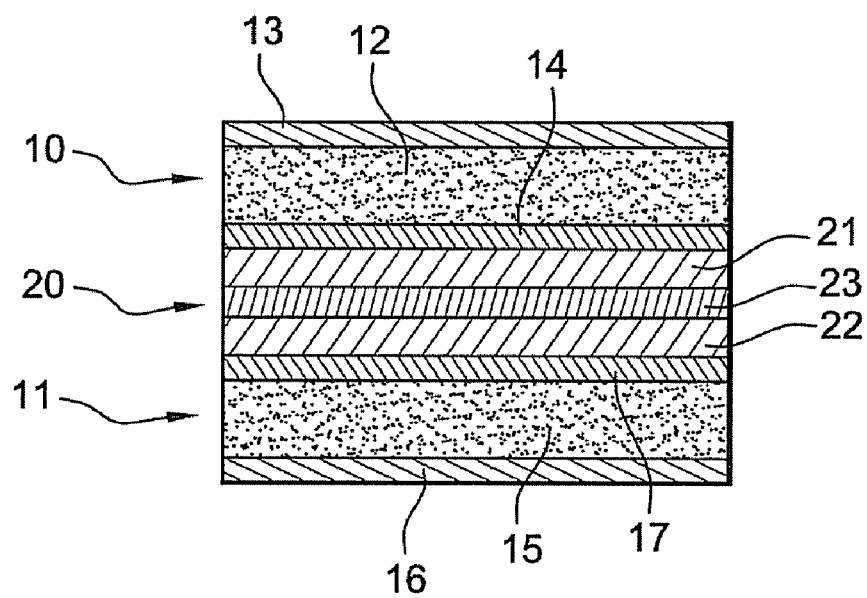
FIGS. 3 and 4 are schematic cross-sectional views of acoustic resonator filters.

Such filters are referred to by the abbreviation BAW-CRF and their simplified operation is shown schematically in FIG. 3 depending on the structures represented.

Such a filter structure comprises two resonators (10, 11). Each resonator comprises a central piezo-electric layer (12) which is sandwiched between two electrodes (13, 14). The second resonator (11) comprises a similar structure with a central layer (15) sandwiched between two electrodes (16, 17).

The two resonators (10, 11) are separated by an assembly of layers. This assembly of layers (20) includes low-acoustic impedance layers (21, 22) between which high-acoustic impedance layers (23) are interposed. In the example shown, the number of layers represented is three but this number can be greater, depending on the particular application. The materials used, classically, are dielectric materials in the case of the low-acoustic impedance layers or metallic materials in the case of the high-acoustic impedance layers. Thus, an electrical signal applied across the two electrodes (13, 14) of the first resonator causes generation of an acoustic field. This acoustic field passes through all the coupling layers (21-23) in the frequency band defined by the acoustic properties of these stacked layers.

The acoustic field thus acts on central layer (15) of the second resonator and causes an electrical signal across the terminals of electrodes (16, 17) of the second resonator.

Figure 4:
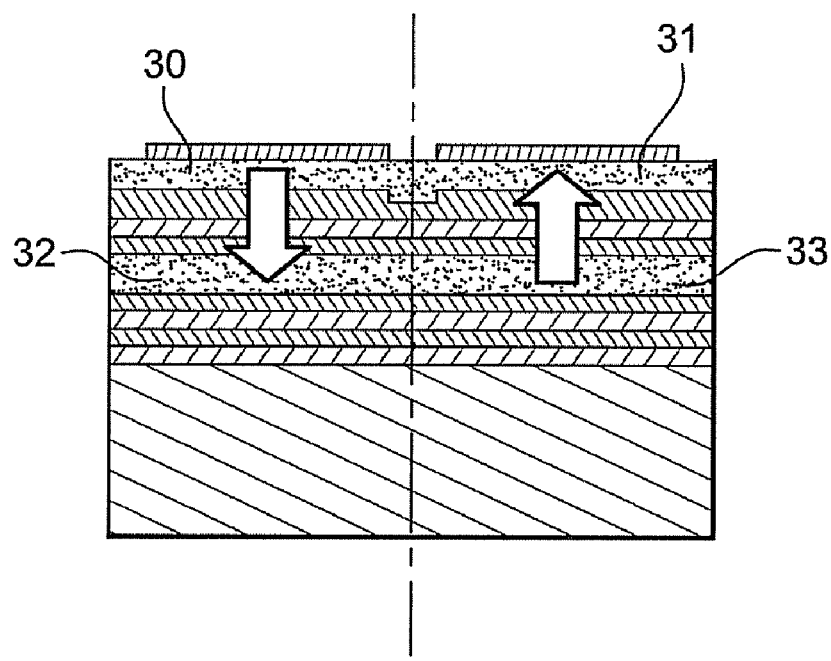

In one particular embodiment shown, in FIG. 4, input resonator (30) and output resonator (31) may be coupled not directly, as in the case of FIG. 3, but indirectly via an assembly of additional resonators (32, 33). These intermediate resonators (32, 33) respectively receive and transmit the acoustic fields received from input resonator (30) and routed to output resonator (31) respectively.

According to the invention, recombining stage (4) can be implemented in various ways depending on the coupling structures which one wishes to use.

Figure 5:
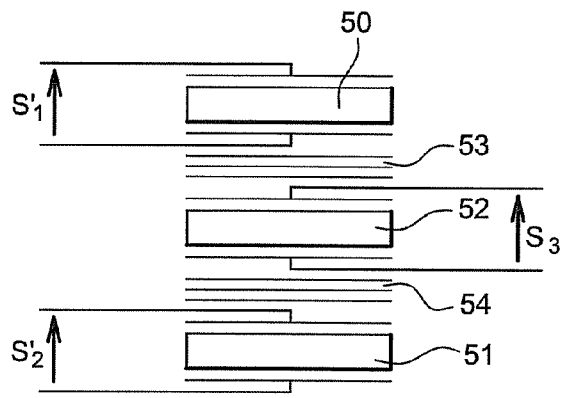
FIG. 5 is a view showing a first embodiment of the recombining stage.

Thus, as shown in FIG. 5, the two amplified signals $s'_1$ and $s'_2$ are applied to input resonators (50, 51) respectively. The acoustic fields generated by each of these input resonators (50, 51) propagate in output resonator (52) via stacked acoustic layers (53, 54). In this case, coupling between the input resonator and the output resonator is acoustic only. The acoustic fields are therefore summed in the output resonator which outputs an output signal $s_3$ which is equivalent to the sum of the two signals $s'_1$ and $s'_2$, less any acoustic losses.

In the case in question, input resonator (50) and output resonator (51) of the recombining stage must be produced by stacking them one on top of the other on the axis along which the acoustic energy propagates.

Figure 6:
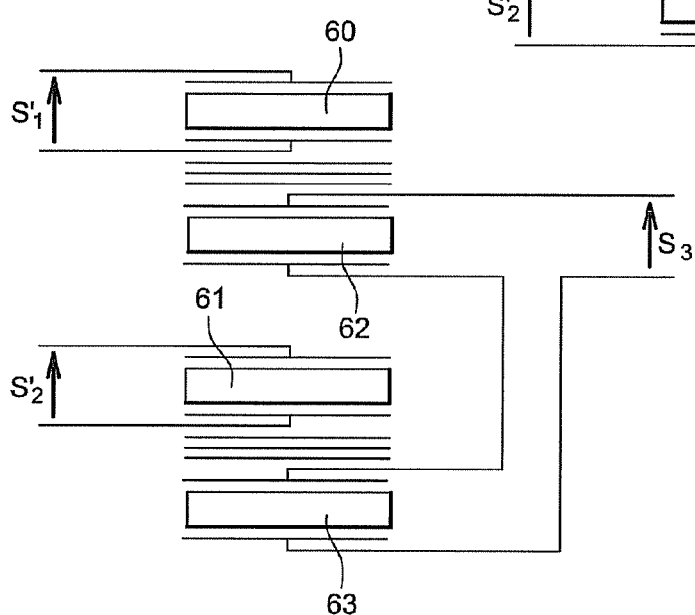
FIGS. 6, 7 and 8 are similar views showing other embodiments.

In a second embodiment shown in FIG. 6, the two input resonators (60, 61) are individually connected to two output resonators (62, 63). Each output resonator (62, 63) therefore produces an electrical signal $s_3$ which corresponds respectively to the amplified signals $s'_1$, $s'_2$.

Output resonators (62, 63) are electrically connected in series in such a way that the output signal corresponds to the sum of the voltages generated by each of the output resonators (62, 63). Summing of two amplified signals is therefore obtained by connecting the two output resonators in series.

Figure 7:
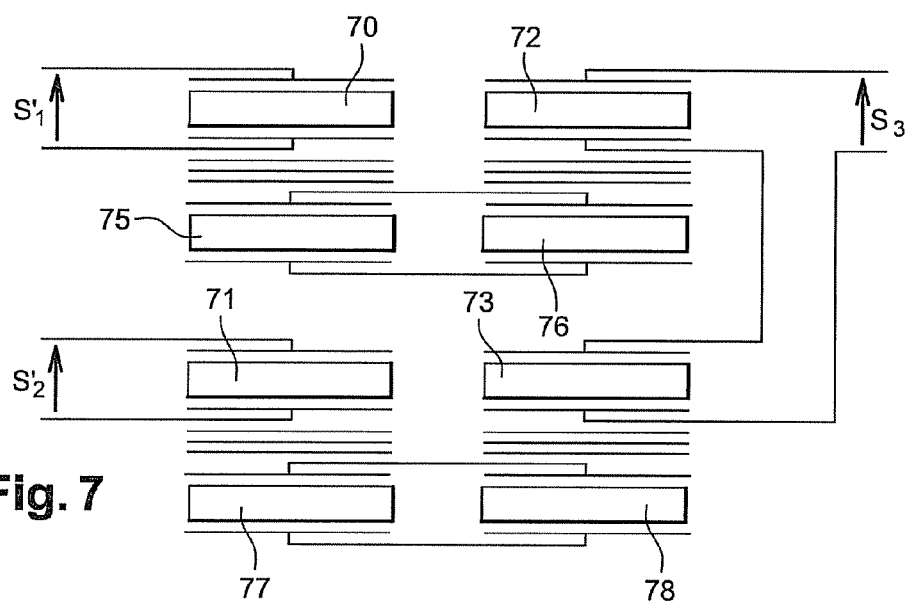

In an alternative embodiment shown in FIG. 7, input resonators (70, 71) are not directly acoustically connected to output resonators (72, 73). In contrast, the assembly of additional resonators (75, 76, 77, 78) ensure transmission of the acoustic field between the input resonators and the output resonators.

As in the embodiment shown in FIG. 4, this makes it possible to produce output and input resonators which are located in the same plane. The filter structure can therefore be regarded as a two-stage structure.

Figure 8:
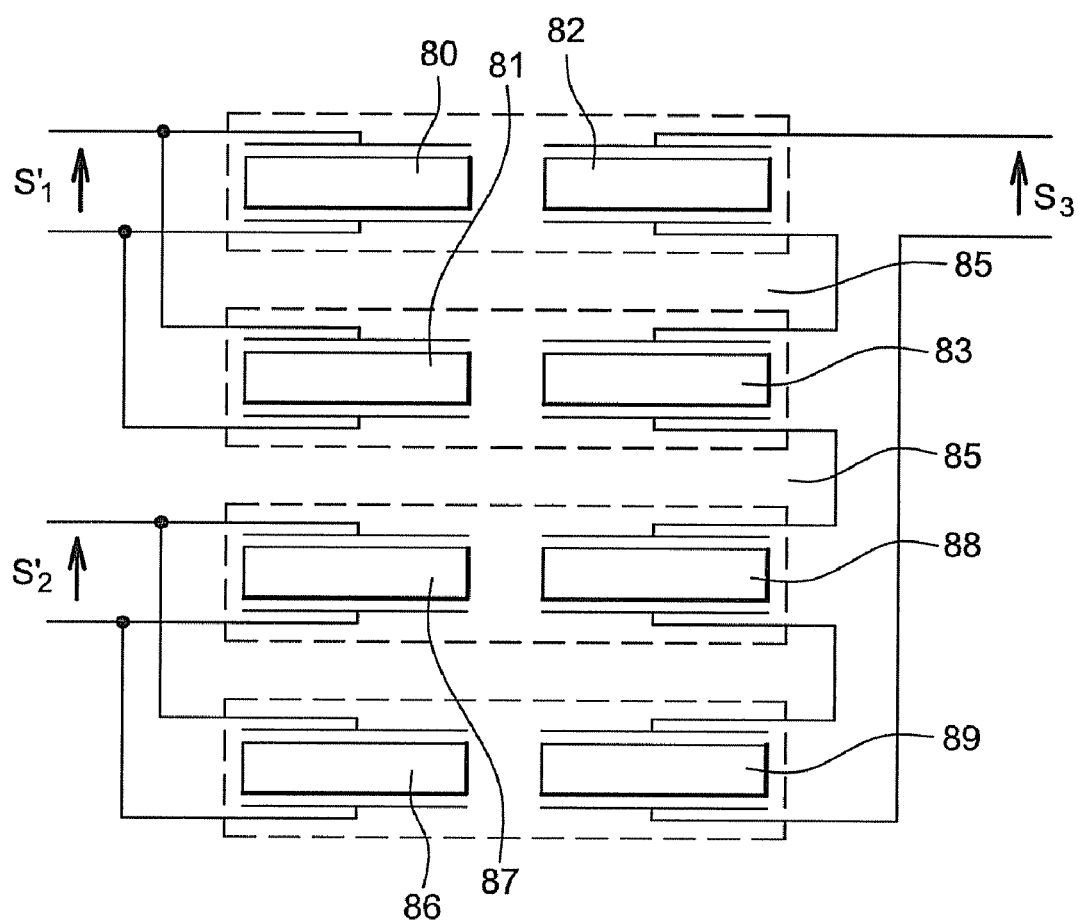

According to another aspect of the invention, it is possible to produce a combination of BAW-CRF filters in such a manner as to ensure impedance matching to the output impedance which, generally speaking, is determined by the transmitting antenna. Thus, as shown in FIG. 8, input signal $s'_1$ feeds two input resonators (80, 81), the electrodes of which are in parallel. The impedance seen at the level of the input is therefore equivalent to half the impedance of each of the resonators.

These input resonators (80, 81) are connected to output resonators (82, 83) via a resonator stage (85) in the embodiment shown. The same applies to the processing of the second amplified signal which feeds two input resonators (86, 87) which are acoustically coupled to output resonators (88, 89). The four output resonators (82, 83, 88, 89) are also connected in series so that the output impedance is substantially equivalent to four times the per-unit impedance of one output resonator.

This setup makes it possible to ensure impedance conversion between the stage input and output so that it can be matched to the required impedance value.

Thus, one can achieve the power level required in the transmission standards for mobile applications whilst retaining the low bias voltage levels which are generally used with this type of filter structure.

Obviously, more complex setups which include a different number of resonators can be implemented depending on the sought-after values.

Generally speaking, the other components of the various stages of the filter can be produced using conventional technologies. The first stage (2) which generates the outphased signals can be produced using CMOS or BiCMOS type integration technologies. Similarly, identification stage (3) can be produced using the same type of technologies or even, preferably, GaAs, InP or similar integration technologies.

In one particular embodiment, the first stage may include intermediate filters making it possible to eliminate any distortion of the outphased signals. These filters make it possible to reduce the spectrum of the signals fed to the power amplifiers, hence improving amplification efficiency in terms of generated noise and harmonics. These intermediate filters can be produced using various technologies, preferably BAW-CRF technology, in order to obtain smaller overall dimensions and lower insertion losses.

The above description makes it apparent that amplifier modules in accordance with the invention have several advantages, especially lower energy consumption compared with currently known solutions. In fact, the invention makes it possible to use a non-linear power amplifier which has a very high energy efficiency and this makes it possible to reduce the power consumed by the filter.

Moreover, the insertion losses of BAW-CRF filters are very low, of the order of 2 to 3 dB and this makes it possible to reduce energy dissipation in the recombining stage or even, in the case of an intermediate BAW-CRF filter, reduce the required gain of the power amplifiers, consequently reducing the amount of power they consume.

Besides this, filters according to the invention therefore allow amplification of a complex signal having a variable envelope by non-linear amplifiers without introducing significant distortion.

What is more, thanks to the high selectivity of BAW-CRF filters, it is possible to reduce the generation of interference outside the frequency band of the amplifier module considerably.

Finally, filters according to the invention are especially advantageous in terms of their overall dimensions and cost because they can include components mounted using flip-chip technologies.

The invention therefore has a particular application, merely by way of example and not exclusively, in radio-frequency amplifier modules in EDGE or $3^{rd}$ generation type mobile phone systems.

The invention claimed is:

1. A power amplifier filter for radio-frequency signals having an outphasing type architecture comprising a first stage capable of generating, from an input signal s(t), two signals $s_1(t)$, $s_2(t)$ having an identical amplitude but phase shifted relative to each other, a second amplifier stage for said signals $s_1(t)$, $s_2(t)$, and a third recombining stage capable of summing the two signals $s'_1(t)$, $s'_2(t)$ obtained from second stage (3), wherein the recombining stage includes an assembly of acoustic wave resonators coupled to each other, some of these resonators referred to as "input resonators" being connected to the outputs of second stage and others of these resonators referred to as "output resonators" being connected to the output terminals of the filter.

2. An amplifier filter as claimed in claim 1, wherein input resonators are acoustically connected to the output resonators, the output electrodes of which form the output terminals of the filters.

3. An amplifier filter as claimed in claim 1, wherein output resonators are electrically connected to each other.

4. An amplifier filter as claimed in claim 1, wherein input resonators are connected to output resonators by one or more series of intermediate resonators.

5. An amplifier filter as claimed in claim 1, wherein the output resonators are electrically connected in series.

6. An amplifier filter as claimed in claim 1, wherein the input resonators assigned to one output ($s'_1$, $s'_2$) of amplifier stage are connected in parallel.

7. An amplifier filter as claimed in claim 1, wherein it comprises an intermediate filter stage interposed between the first stage and the second stage.

8. An amplifier filter as claimed in claim 1, wherein the intermediate filter stage includes an assembly of bulk acoustic wave-coupled resonators.

* * * * *